(12) United States Patent
Luo

(10) Patent No.: US 12,095,450 B2
(45) Date of Patent: *Sep. 17, 2024

(54) HIGH-SPEED SWITCH WITH ACCELERATED SWITCHING TIME

(71) Applicant: pSemi Corporation, San Diego, CA (US)

(72) Inventor: Chengkai Luo, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/305,888

(22) Filed: Apr. 24, 2023

(65) Prior Publication Data

US 2023/0344421 A1 Oct. 26, 2023

Related U.S. Application Data

(63) Continuation of application No. 17/677,292, filed on Feb. 22, 2022, now Pat. No. 11,641,196, which is a
(Continued)

(51) Int. Cl.
*H03K 17/04* (2006.01)
*H03K 17/0412* (2006.01)
*H03K 17/693* (2006.01)

(52) U.S. Cl.
CPC ..... *H03K 17/04123* (2013.01); *H03K 17/693* (2013.01)

(58) Field of Classification Search
CPC ....... H03K 17/04106; H03K 17/04163; H03K 17/04206; H03K 17/063; H03K 17/08104; H03K 17/08122; H03K 17/08142; H03K 17/0822; H03K 17/102; H03K 17/122; H03K 17/13; H03K 17/133; H03K 17/145; H03K 17/161; H03K 17/162;
(Continued)

(56) References Cited

U.S. PATENT DOCUMENTS 5,467,047 A 11/1995 Robb
6,205,010 B1 3/2001 Ohsaka
(Continued)

OTHER PUBLICATIONS

Tra, Anh Quan, Office Action received from the USPTO dated Nov. 19, 2018 for U.S. Appl. No. 15/659,311, 8 pgs.
(Continued)

*Primary Examiner* — Quan Tra
(74) *Attorney, Agent, or Firm* — JAQUEZ LAND GREENHAUS & McFARLAND LLP; John Land, Esq.

(57) ABSTRACT

A method and apparatus is disclosed for maintaining a stable power supply to a circuit when activating/deactivating a switch in order to accelerate the switching time of the switch. The gate of a FET is coupled to a switch driver. The switch driver is powered by a positive power supply and a negative power supply. When the switch is to be activated/deactivated, the gate is first coupled to a reference potential (i.e., ground) for a "reset period" to reduce any positive/negative charge that has been accumulated in the FET. At the end of the reset period, the gate is then released from the reference potential and the switch driver drives the gate to the desired voltage level to either activate or deactivate the switch.

20 Claims, 10 Drawing Sheets

Related U.S. Application Data continuation of application No. 17/164,467, filed on Feb. 1, 2021, now Pat. No. 11,264,981, which is a continuation of application No. 16/703,537, filed on Dec. 4, 2019, now abandoned, which is a continuation of application No. 15/659,311, filed on Jul. 25, 2017, now Pat. No. 10,511,297.

(58) Field of Classification Search
CPC .. H03K 17/163; H03K 17/164; H03K 17/165; H03K 17/166; H03K 17/167; H03K 17/223; H03K 17/284; H03K 17/687; H03K 17/6871; H03K 17/6872; H03K 17/6874; H03K 17/6877; H03K 17/689; H03K 17/6895; H03K 17/691; H03K 17/693; H03K 2017/6875; H03K 2017/6878

See application file for complete search history.

(56) References Cited

U.S. PATENT DOCUMENTS

| | | | |
|---|---|---|---|
| 6,518,848 B2 * | 2/2003 | Teraishi | H03K 5/19 |
| | | | 331/74 |
| 9,548,730 B1 * | 1/2017 | Helm | H03K 17/102 |
| 10,511,297 B2 | 12/2019 | Luo | |
| 11,264,981 B2 | 3/2022 | Luo | |
| 11,641,196 B2 | 5/2023 | Luo | |
| 2004/0075486 A1 | 4/2004 | Takehara | |
| 2008/0174184 A1 | 7/2008 | Arpilliere | |
| 2013/0321063 A1 | 12/2013 | Cozzolino | |
| 2017/0104481 A1 | 4/2017 | Ko | |
| 2019/0036520 A1 | 1/2019 | Luo | |
| 2020/0076411 A1 | 3/2020 | Lee | |
| 2020/0186139 A1 | 6/2020 | Luo | |
| 2021/0265990 A1 | 8/2021 | Luo | |
| 2022/0247401 A1 | 8/2022 | Luo | |

OTHER PUBLICATIONS

Tra, Anh Quan, Final Office Action received from the USPTO dated Mar. 8, 2019 for U.S. Appl. No. 15/659,311, 8 pgs.

Tra, Anh Quan, Notice of Allowance received from the USPTO dated Aug. 12, 2019 for U.S. Appl. No. 15/659,311, 5 pgs.

PSEMI CORPORATION, Response filed in the USPTO dated Jun. 4, 2019 for U.S. Appl. No. 15/659,311, 8 pgs.

PSEMI CORPORATION, Response filed in the USPTO dated Feb. 15, 2019 for U.S. Appl. No. 15/659,311, 10 pgs.

Tra, Anh Quan, Office Action received from the USPTO dated Apr. 17, 2020 for U.S. Appl. No. 16/703,537, 11 pgs.

Tra, Anh Quan, Final Office Action received from the USPTO dated Oct. 30, 2020 for U.S. Appl. No. 16/703,537, 7 pgs.

Tra, Anh Quan, Advisory Action received from the USPTO dated Jan. 8, 2021 for U.S. Appl. No. 16/703,537, 3 pgs.

PSEMI CORPORATION, Response filed in the USPTO dated Oct. 19, 2020 for U.S. Appl. No. 16/703,537, 6 pgs.

PSEMI CORPORATION, Response filed in the USPTO dated Oct. 29, 2020 for U.S. Appl. No. 16/703,537, 8 pgs.

Tra, Anh Quan, Office Action received from the USPTO dated Jun. 18, 2021 for U.S. Appl. No. 17/164,467, 13 pgs.

Tra, Anh Quan, Notice of Allowance received from the USPTO dated Oct. 20, 2021 for U.S. Appl. No. 17/164,467, 7 pgs.

Tra, Anh Quan, Office Action received from the USPTO dated Aug. 23, 2022 for U.S. Appl. No. 17/677,292, 12 pgs.

Tra, Anh Quan, Notice of Allowance received from the USPTO dated Dec. 1, 2022 for U.S. Appl. No. 17/677,292, 7 pgs.

\* cited by examiner

US 12,095,450 B2

HIGH-SPEED SWITCH WITH ACCELERATED SWITCHING TIME

CROSS REFERENCE TO RELATED APPLICATIONS—CLAIM OF PRIORITY

This application is a continuation of commonly owned and co-pending U.S. application Ser. No. 17/677,292, filed Feb. 22, 2022, entitled "High-Speed Switch with Accelerated Switching Time", to issue on May 2, 2023 as U.S. Pat. No. 11,641,196, the disclosure of which is incorporated herein by reference in its entirety. Application Ser. No. 17/677,292 is a continuation of commonly owned U.S. application Ser. No. 17/164,467, filed Feb. 1, 2021, entitled "High-Speed Switch with Accelerated Switching Time", issued on Mar. 1, 2022 as U.S. Pat. No. 11,264,981, the disclosure of which is incorporated herein by reference in its entirety. Application Ser. No. 17/164,467 is a continuation of commonly owned U.S. application Ser. No. 16/703,537, filed Dec. 4, 2019, entitled "High-Speed Switch with Accelerated Switching Time", now abandoned, the disclosure of which is incorporated herein by reference in its entirety. Application Ser. No. 16/703,537 is a continuation of commonly owned U.S. application Ser. No. 15/659,311, filed Jul. 25, 2017, entitled "High-Speed Switch with Accelerated Switching Time", now U.S. Pat. No. 10,511,297 issued Dec. 17, 2019, the disclosure of which is incorporated herein by reference in its entirety.

BACKGROUND

Technical Field

This disclosure generally relates to switches and more specifically to high-speed switches for switching radio frequency and other electronic signals.

Background

A growing demand for switches having ever-greater power handling capability has created an increased reliance on large switches. In some cases, such switches are implemented using a number of stacked field effect transistors. One example of a situation that requires the use of large switches is found in transceivers. A receive/transmit (R/T) switch allows one antenna to be used for both transmissions and reception.

FIG. 1 is a simplified schematic showing an example of a multiport switch, such as a three-port switch 100. The three-port switch 100 has three ports, a first port 101, a second port 104 and a third port 118. Four switch control signals are applied to four respective switch control ports 106, 107, 109, 111. The switch control signals control the configuration of four switch branches 108, 110, 112, 114 within the three-port switch.

The first switch branch 108 is coupled between the first port 101 and the second port 104. The second switch branch 110 is coupled between the second port 104 and ground. The third switch branch 112 is coupled between the first port 101 and the third port 118. The fourth switch branch 114 is coupled between the third port 118 and ground.

When the three-port switch 100 is in a first mode, a "Sw. 1 Control" signal applied to the first switch control port 106 causes the first switch branch 108 to close, creating a path from the first port 101 to the second port 104. In addition, a "Sw. 2 Control" signal applied to the second switch control port 107 causes the second switch branch 110 to open. Therefore, the first port 101, the path from the second port 104 through the second switch branch 110 to ground is opened. Concurrently, a "Sw. 3 Control" signal applied to the third switch control port 109 causes the third switch branch 112 to open, disconnecting the first port 101 from the third port 118. Furthermore, a "Sw. 4 Control" signal applied to the fourth control signal port 111 causes the fourth switch branch 114 to close, thus coupling the third port 118 to ground. Thus, in the first mode the first port 101 is coupled to the second port 104 and the third port 118 is shunted to ground, thus isolating the third port 118 from the first and second ports 101, 104.

In some cases, the switches need to be capable of handling the high power signals, requiring switches having relatively high stacking (i.e., relatively large number of "stacked FETs"). A "stacked FET" comprises at least two FETs having the source or drain of a preceding FET connected to the source or drain of a subsequent FET, thus placing the FETs in series, each FET being controlled by essentially the same gate signal through gate resistors associated with each FET, such that all of the FETs of the stack turn on and off together. The total width of each FET in the stack is typically increased to compensate for increases in the ON resistance ($R_{on}$) that would otherwise occur due increasing the number of series FETs. Increasing the total width of each FET helps maintain an overall low $R_{on}$ when the FETs are switched on. In some cases, the drain and source of the FETs used to implement the stacked FET switches are interchangeable. The increased parasitic capacitance of the gates when the FETs are stacked results in an increase in switching time (i.e., the amount of time between a signal transition at the gate of the FETs and the resulting change in impedance between the source and drain of those FETs). Switching time is an important performance parameter for some switches, such as receive/transmit (R/T) switches and others. For switches capable of handling high power signals, the switching time increases due to capacitive loading at the outputs of the drivers that switch the FET gates. This is discussed in further detail below.

FIG. 2 is a more detailed schematic of switch branch 112 of FIG. 1. The switch branch 112 shown in FIG. 2 is representative of one way the switch branches 108, 110, 112, 114 of the switch 100 may be implemented. It should be understood that not all of the switch branches 108, 110, 112, 114 need to be implemented the same way. It should also be understood that FIG. 2 is a simplified schematic of the switch branch 112.

In some cases, the switch branch 112 is implemented using a stacked FET structure 301 (hereafter referred to simply as "FET 301"). A switch driver 305 can be provided to control the gate of the FET 301 and selectively turn the switch branch 112 on or off. The switch driver 305 is powered by a +3v power supply $V_{DD}$ and a −3v power supply $V_{SS}$. The input to the switch driver 305 determines whether the FET 301 is conducting or not (i.e., whether the switch is open or closed). In the case of an NMOS FET, a positive voltage applied to the gate of the FET 301 will turn the FET 301 on and thus allow a current to flow between the drain and the source. Applying a negative voltage to the gate of the FET 301 turns the FET 301 off. Accordingly, little or no current flows from the drain to the source.

FIG. 3 is a graph showing the ideal operation of the switch branch 112. Depicted in FIG. 3 is a voltage level 401 of a signal 303 applied to the gate of the FET 301, such as the stacked FET used to implement the switch branch 112 (see FIG. 2) within the three-port switch 100 (see FIG. 1). Also shown is a voltage level 403 of a −3 volt power supply $V_{SS}$ used to provide power to the driver 305 of the switch branch 112.

When a switch control signal 109 (see FIG. 2) changes state, the output of the driver 305 changes state. Ideally, the gate voltage 401 of the FET 301 starts at a level equal to the voltage of the $V_{DD}$ power supply. In response to the change in state, the gate voltage 401 is pulled from +3v to −3v by the driver 305. Upon crossing through the threshold (i.e., the turn off voltage) of the FET 301, the FET 301 ceases conducting, thus turning off the switch branch 112. In the example shown, the voltage $V_{DD}$ is +3v and the voltage $V_{SS}$ is −3v.

At time $t_1$, control signal 303 initiates FET 301 turning off. However, there is a delay between the time the signal 303 starts to drop and the time the switch branch 112 turns off (i.e., time $t_2$). If $V_{SS}$ holds relatively steady at −3v, the "turn off time" of the FET 301 is relatively fast. However, with a stacked FET 301 having a relatively large parasitic capacitance, the amount of charge necessary to turn off the stacked FET 301 is substantial. That is, the amount of charge that must be removed from the gate of the FET 301 can present a substantial load to the driver 305.

FIG. 4 illustrates that the voltage of $V_{SS}$ can raise in response to the large transfer of charge at the output of the driver 305 by the charge present at the gate of the FET 301 (i.e., due to the stored charge in the FET 301). In some cases, the effect of the loading at the output of the driver 305 is more prevalent when trying to pull the gate of the FET 301 to −3v to turn the FET 301 off than it is when trying to pull the gate up to +3v to turn the FET 301 on. This is due to the relative "weakness" of the −3v source compared to the relative strength of the +3 volt source. That is, in some cases in which the −3v $V_{SS}$ has been generated from the 3v $V_{DD}$ by a circuit fabricated on the same integrated circuit as the FET 301, the voltage source $V_{SS}$ is considered to be weak, since it is not able to maintain a stable −3 volt output in the face of the relatively large charge at the gate of the FET 301. However, this effect can occur both when attempting to turn the FET 301 on as well as when attempting to turn the FET 301 off. The result of the load at the output of the driver 305 is that the FET 301 is slow to turn off due to the rise in the level of $V_{SS}$. It can be seen in FIG. 4 that the FET 301 turns off at time $t_{2'}$. The turn off time (i.e., time between $t_1$ and $t_{2'}$) when $V_{SS}$ rises (as shown in FIG. 4) is substantially longer than turn on time if $V_{SS}$ remains unchanged (as shown in FIG. 3), since the gate voltage reaches the desired $V_{SS}$ slower.

Accordingly, it can be seen that an important factor in determining how long it takes for the FET 301 to turn off is the size of the FET 301 (both number of stacked FETs and the dimensions of each of the FETs), the amount of charge that needs to be drained from the FET 301 through the gate and the effect that charge has on $V_{SS}$.

Therefore, there is a need to mitigate the loading effect in order to improve the switching time as well as voltage source settling time for switches capable of switching signals having high power levels.

SUMMARY

A method and apparatus is disclosed for maintaining a stable power supply to a circuit when activating/deactivating a switch, such as a multiport switch, in order to reduce the switching time of the switch. In some embodiments of the disclosed method and apparatus, the switch is implemented using at least one field effect transistor (FET). The gate of the FET is coupled to a switch driver. The switch driver is powered by a positive power supply and a negative power supply. When the switch is to be activated/deactivated, the gate is first coupled to a reference potential (ground for example) for a "reset period" to reduce any positive/negative charge that has been accumulated on the gate of the FET. At the end of the reset period, the gate is then released from the reference potential and the switch driver drives the gate to the desired voltage level to either activate or deactivate the switch. By "resetting" the FET to the reference potential between $V_{DD}$ and $V_{SS}$ (e.g., ground) before allowing the switch driver to drive the gate of the FET, the effect of loading the power supply is minimized. Minimizing the effect on the power supply speeds up the switching time of the switch. The gate may be driven to any intermediate voltage potential between the negative and positive voltage potentials provided as the switch driver power supply voltages in order to reduce the load on the input of the switch driver during transitions of the switch from open to closed.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 5:
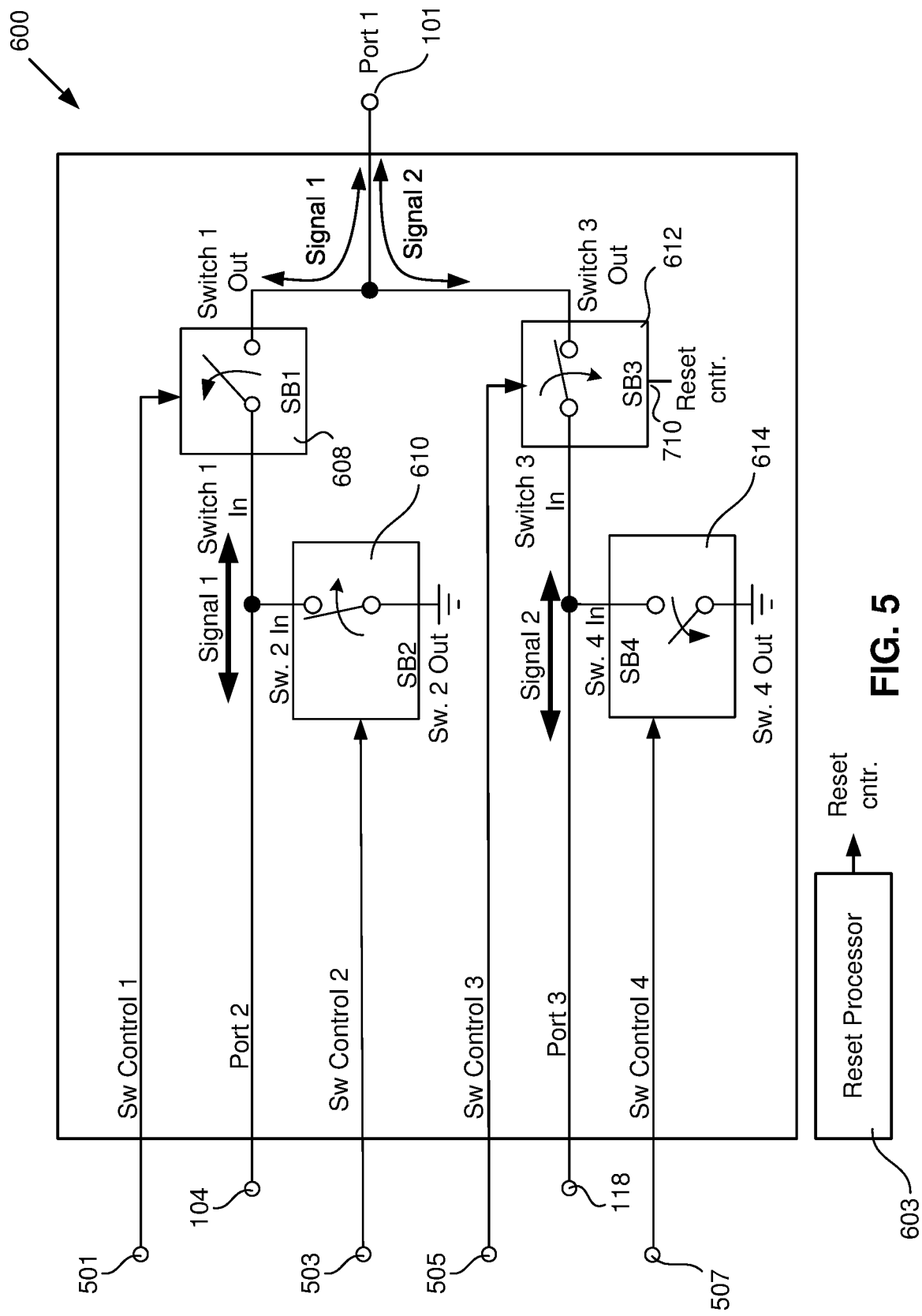
FIG. 5 is a simplified three-port switch in accordance with some embodiments of the presently disclosed method and apparatus.

FIG. 5 is a simplified schematic of a multiport switch, and more particularly, a three-port switch 600 in accordance with some embodiments of the presently disclosed method and apparatus. However, it will be understood that the three-port switch 600 is provided merely as an example of one embodiment of the disclosed method and apparatus and that the multiport switch may take any form.

The three-port switch 600 has four switch branches 608, 610, 612, 614. In some embodiments, a reset processor 603 is coupled to reset control port 710 of each of the four switch branches 608, 610, 612, 614. Only the connection between the reset processor 603 and the switch branch 612 is shown in FIG. 5 for the sake of simplicity in the figure. Alternatively, the reset control signal is coupled to less than all of the switch branches 608, 610, 612, 614. In addition, in some embodiments, a corresponding one of four, three-port switch control signals is coupled to an associated one of the four switch branches 608, 610, 612, 614 to control when the switch branch is open or closed.

Figure 6:
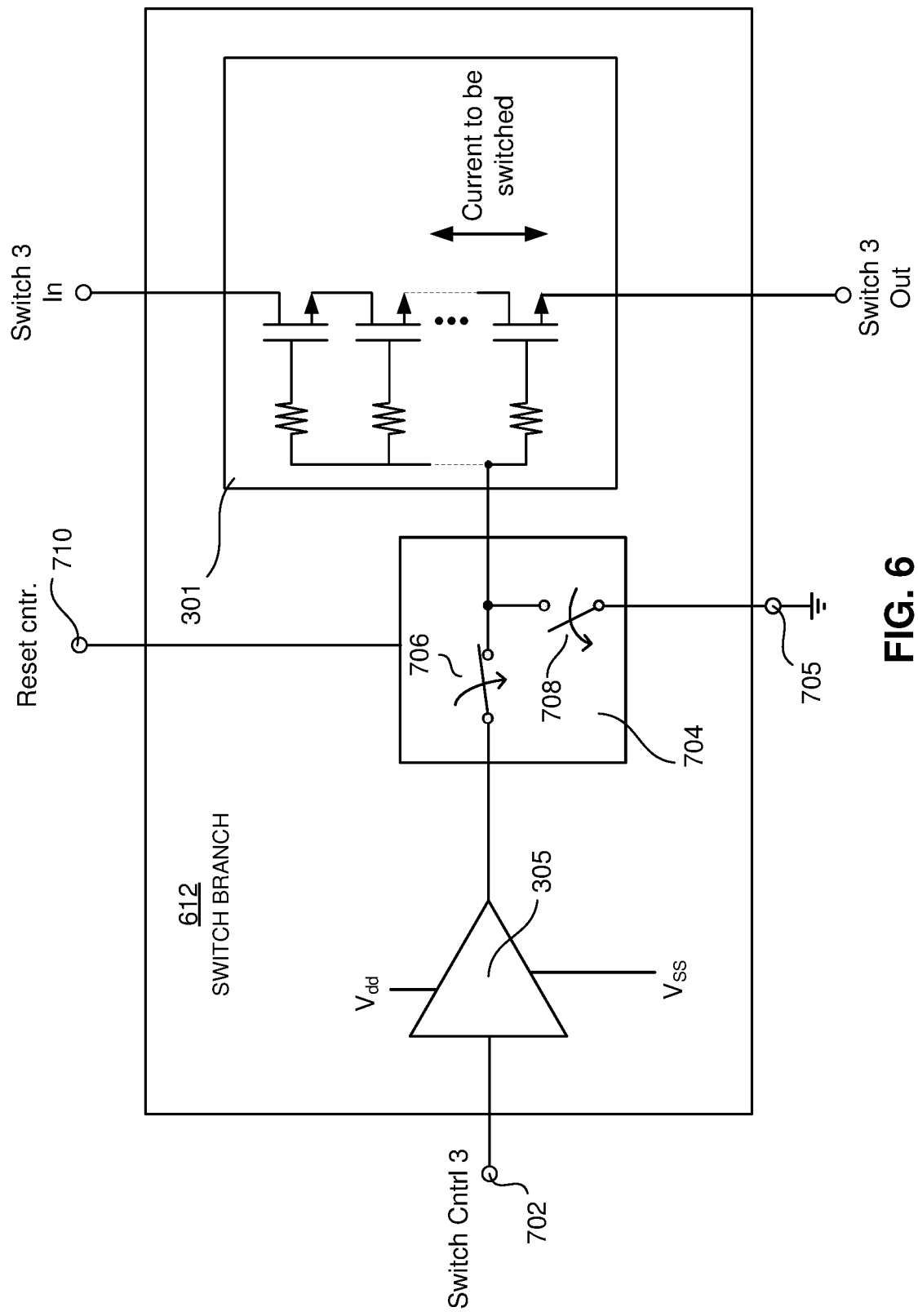
FIG. 6 is a simplified schematic of a switch branch in accordance with some embodiments of the disclosed method and apparatus.

FIG. 6 is a simplified schematic of the switch branch 612. In some embodiments, one or more of the other switch branches 608, 610, 612, 614 are implemented as shown in FIG. 6, however, for the sake of this discussion, the switch shown in FIG. 6 is referred to as switch 612. The switch 612 comprises a switch control input 702, reset control input 710, a stacked FET 301 (hereafter referred to as "FET 301"), a switch driver 305, and a reset circuit 704. The input of the switch driver 305 is coupled to the switch control input 702. In some embodiments, the switch driver 305 is powered by a positive power supply $V_{DD}$ and a negative power supply $V_{SS}$. In some embodiments, $V_{DD}$=3v and $V_{SS}$=−3v.

The reset circuit 704 is shown in the "inactive" state in which a series switch 706 is closed and a shunt switch 708 is open. In an "active" state, the series switch 706 is open and a shunt switch 708 is closed. The reset control input 710 is coupled to the reset circuit 704 and to the reset processor 603. Signals coupled to the reset control input 710 are generated by the reset processor 603. In some embodiments, the reset processor 603 and at least one switch branch reside within the same package and may be formed on the same substrate. Alternatively, the reset processor 603 resides in a separate package and/or is formed on a separate substrate from one or more of the switch branches 608, 610, 612, 614. Accordingly, in some embodiments, not all of the switches 608, 610, 612, 614 are fabricated on the same substrate and housed within the same package.

A reset control signal coupled to the reset control input 710 determines whether the reset circuit 704 is active or inactive. In some embodiments, the switch control 3 signal that is coupled to the switch control input 702 is also coupled to the reset processor 603 to trigger the generation of the reset control signal. The switches 706, 708 within the reset circuit 704 can be implemented as relatively small and fast FETs, since they are only used to reset the gate voltage of the FET 301. That is, resetting the FET 301 does not require a significant voltage handling capability, nor is a large amount of current passed through the series switch 706 and the shunt switch 708.

Figure 7:
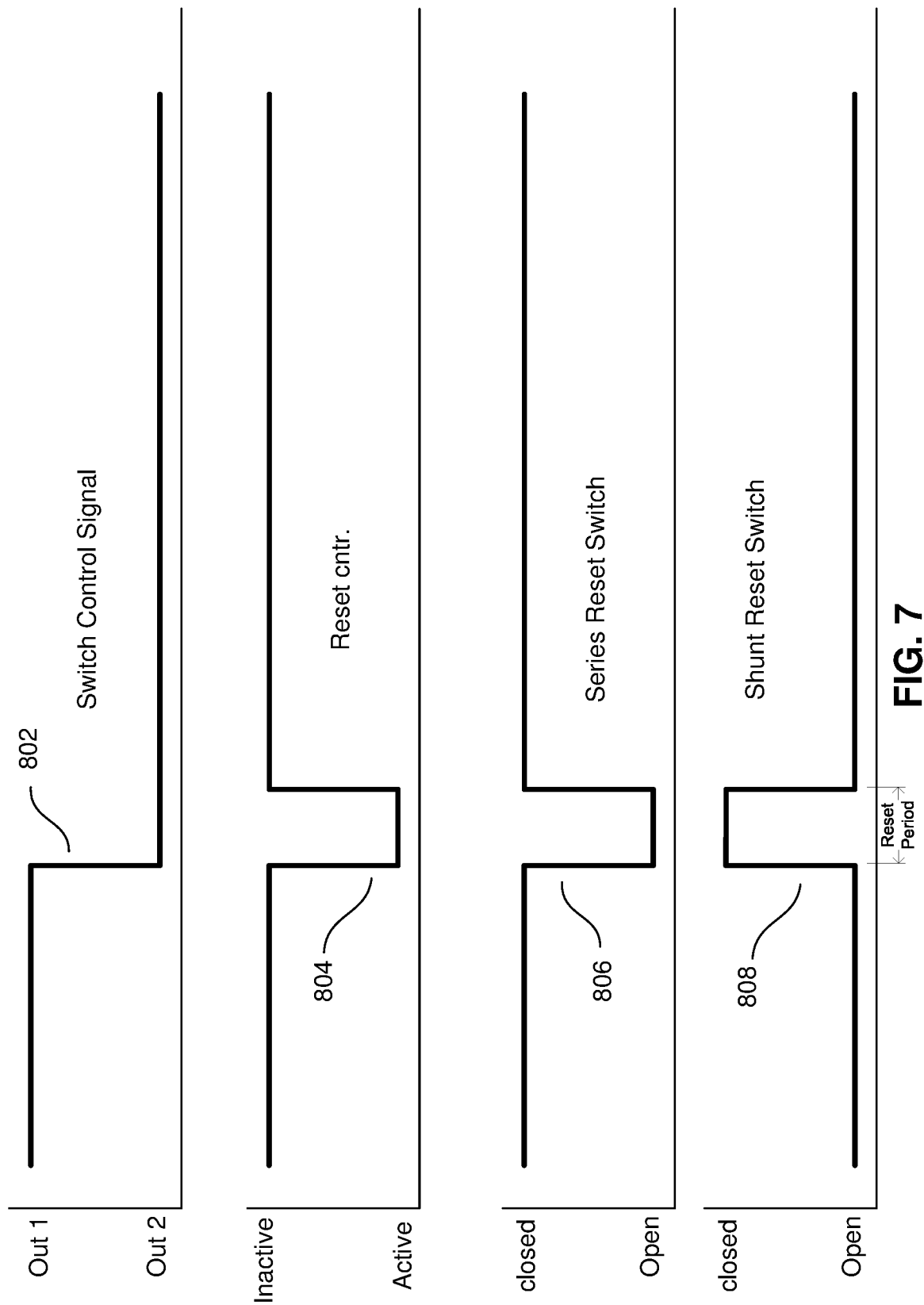
FIG. 7 is a timing diagram illustrating the relative timing of the signals coupled to the switch control input of a switch branch and the reset control input of a reset circuit within the switch branch.

FIG. 7 is a timing diagram illustrating the relative timing of the signals coupled to the switch control input 702 and the reset control input 710. A first plot 802 shows the state of the switch control signal coupled to the switch control input 702. A second plot 804 shows the state of the reset switch control signal coupled to the reset control input 710. A third plot 806 shows the state of the series reset switch 706. A fourth plot 808 shows the state of the shunt reset switch 708.

The signals are coordinated in time by the reset processor 603, such that each time the switch control signal 802 presented at the switch input 702 changes state (e.g., in some embodiments, when the signal goes low), the reset control signal 804 presented to the reset control input 710 will deliver a pulse from the high to low and back to high. The reset control signal activates the reset circuit 704 during a "reset period" and then deactivates the reset circuit 704 at the end of the reset period. The reset processor 603 can be implemented by a programmable device (such as a microprocessor), hardware, a state machine or any other well-known mechanism for generating a pulse upon detecting a change in state of the input to the reset processor 603. In some embodiments, other inputs to the reset processor 603 can be used to assist in determining the duration of the reset period (i.e., how long the reset control signal will keep the reset circuit 704 in the active state).

When the reset circuit 704 is active (i.e., during the reset period), the output of the switch driver 305 is disconnected from the gate of the FET 301 by the series reset switch and shorted to a reference potential input 705 through the shunt reset switch 708. The reference potential input may be coupled to a known reference potential between $V_{DD}$ and $V_{SS}$, such as ground. Therefore, any accumulated charge at the gate of the FET 301 is provided a low resistance path to the reference potential. Consequently, most of the charge accumulated at the gate of the FET 301 is removed (i.e., the gate is placed at the reference potential). At the end of the reset period, the shunt switch 708 is opened and the series reset switch 706 is closed, placing the reset circuit 704 back in the inactive state and allowing the switch driver 305 to drive the gate of the FET 301 to $V_{SS}$, thus turning the FET 301 off. In some embodiments, the reference potential is ground.

By resetting the gate of the FET 301 before the switch driver is attempts to drive the gate to $V_{SS}$, the reset circuit 704 assists in attaining the $V_{SS}$ potential at the gate of the FET 301 (and the output of the switch driver 305) by first placing the gate at the reference potential. Accordingly, at the end of the reset period, when the reset circuit 704 is returned to the inactive state, the switch driver 305 only has to drive the gate of the FET 301 from the reference potential (i.e., ground or another voltage level between $V_{DD}$ and VSS) to $V_{SS}$. Resetting the gate significantly reduces the load on the output of the switch driver 305, thus reducing the rise in $V_{SS}$ as the switch driver 305 attempts to drive the gate of the FET 301 to $V_{SS}$.

Figure 1:
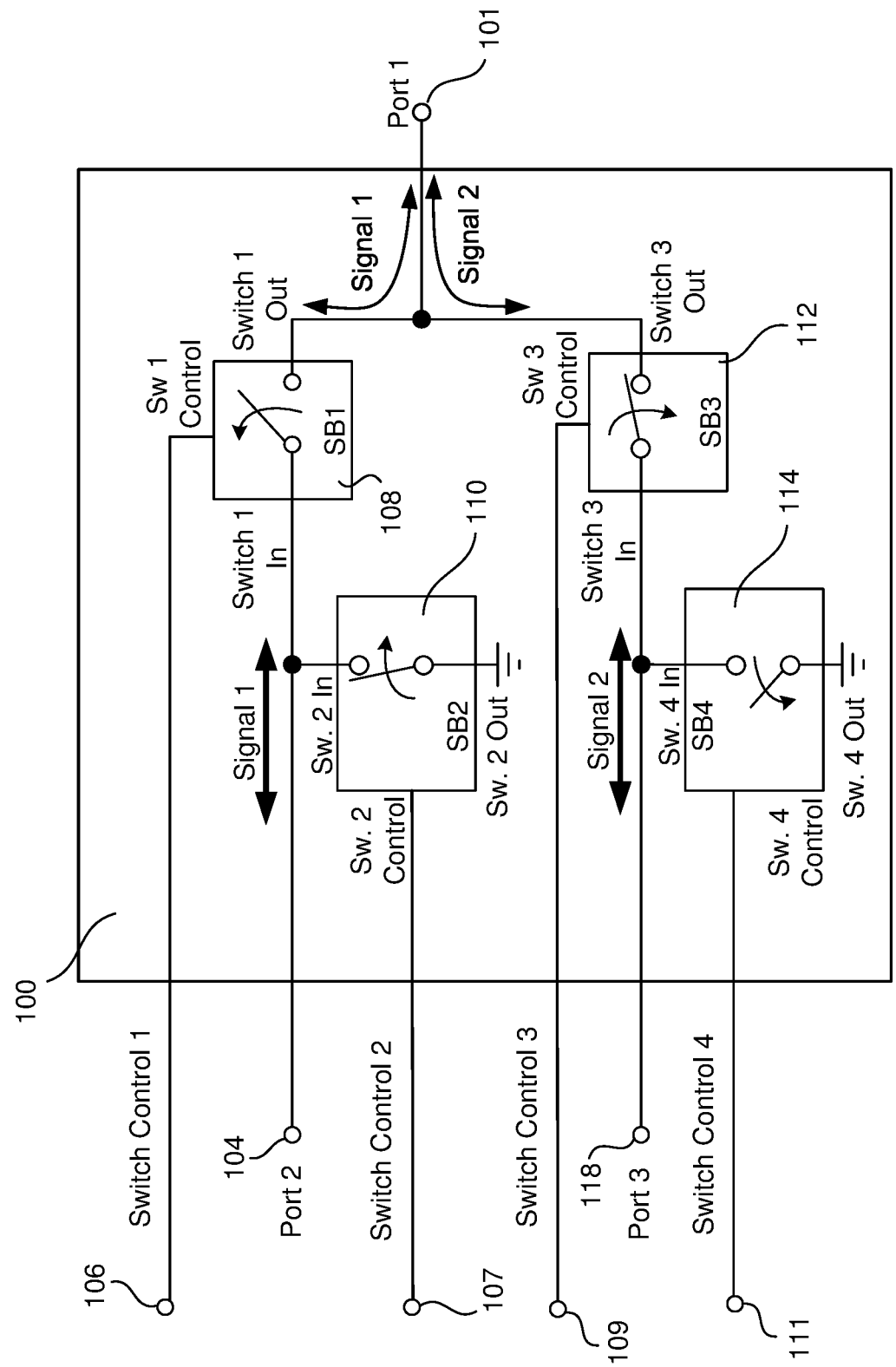
FIG. 1 is a simplified schematic showing an example of a three-port switch.
Figure 2:
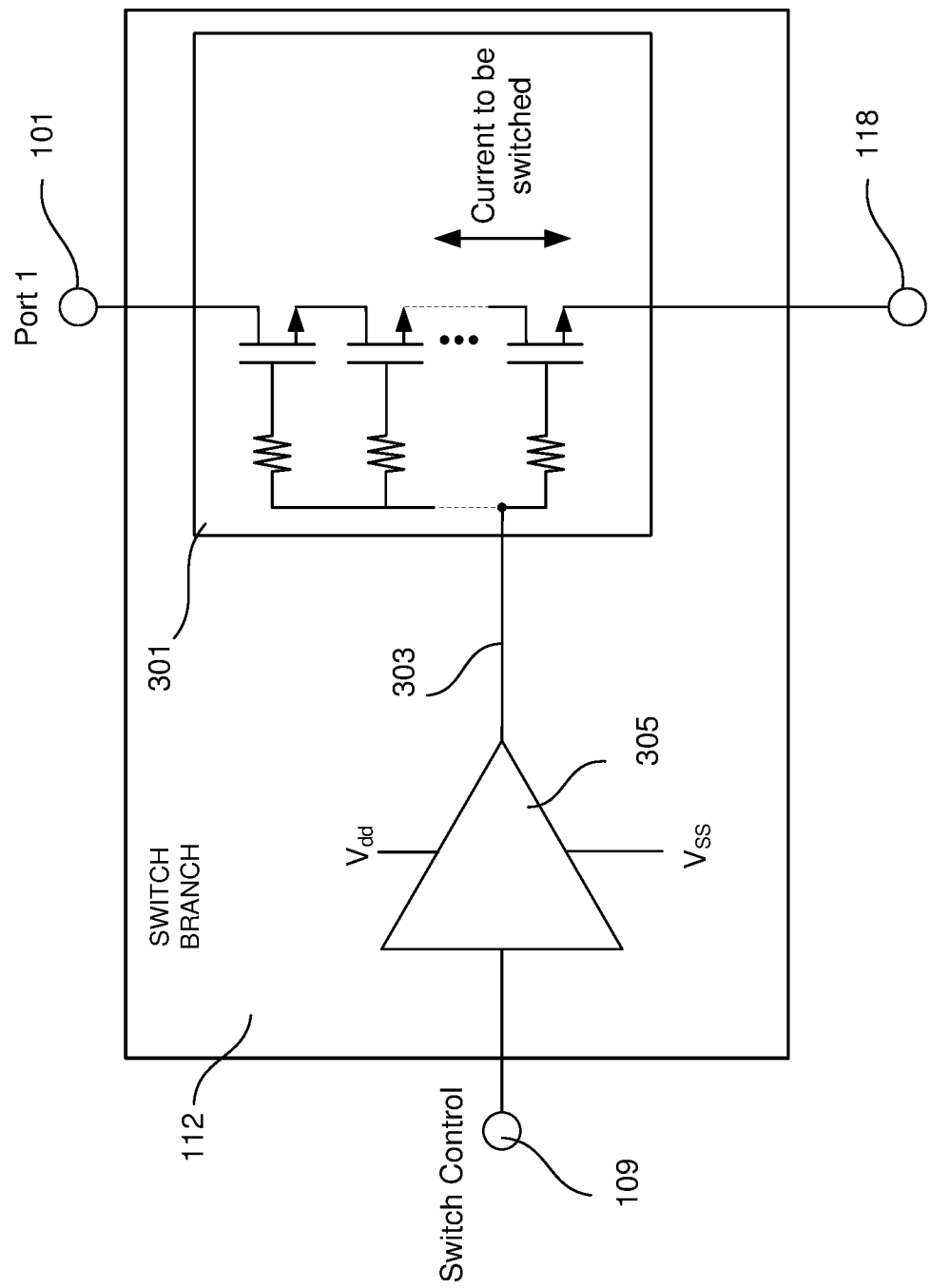
FIG. 2 is a more detailed schematic of a switch branch of FIG. 1 and FIG. 2.
Figure 3:
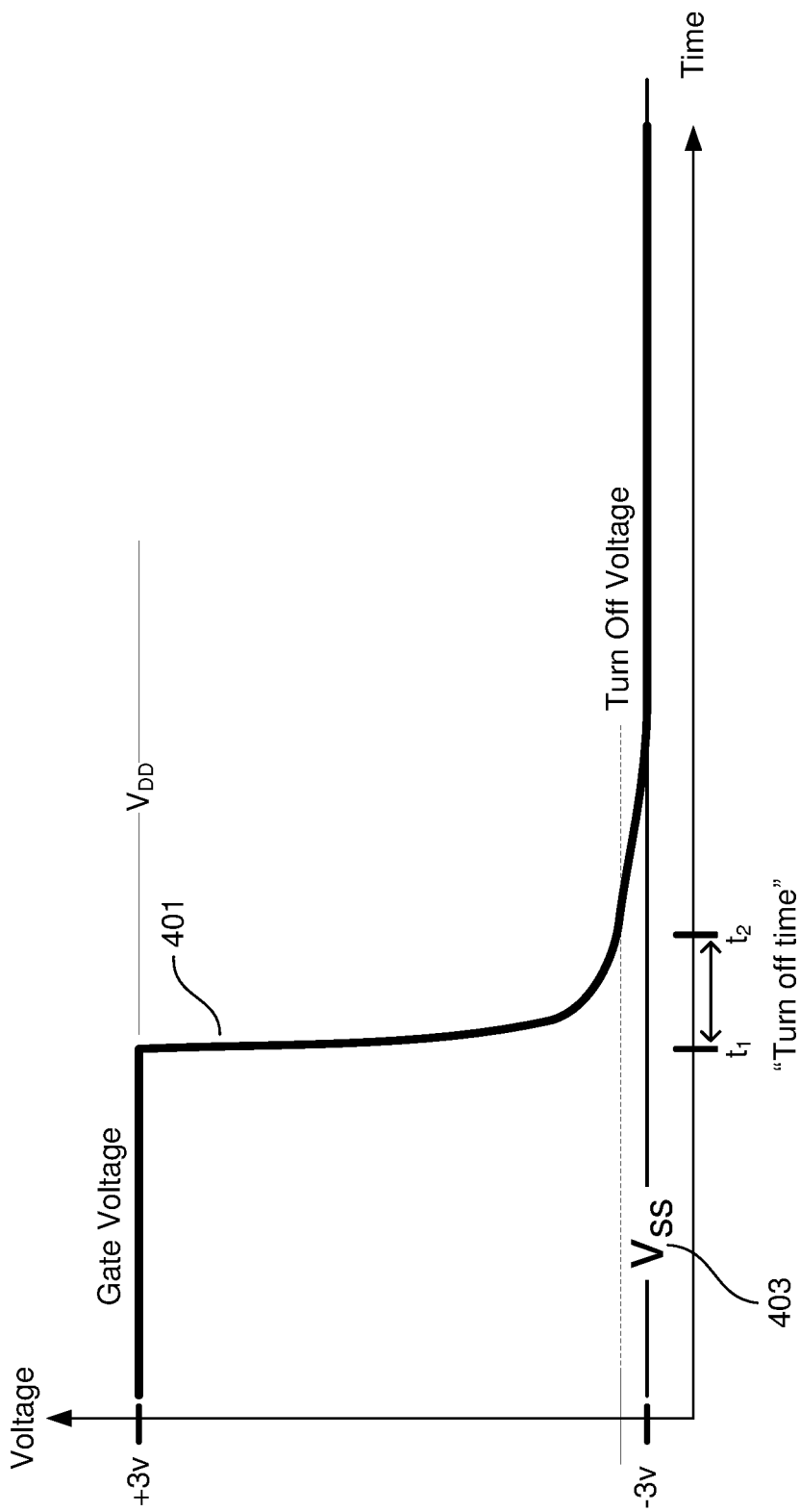
FIG. 3 is a graph showing the ideal operation of one switch branch.
Figure 4:
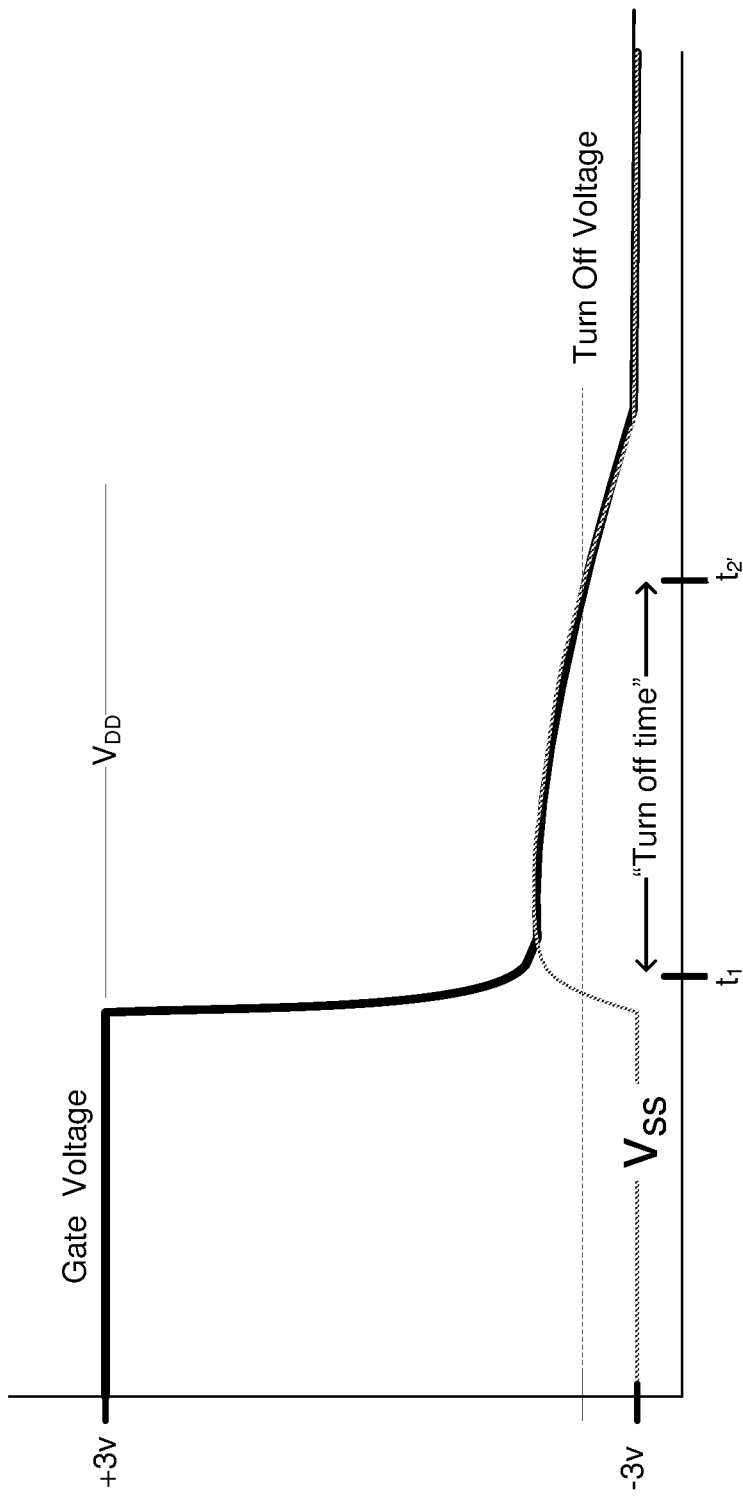
FIG. 4 illustrates that the voltage of $V_{SS}$ can raise in response to the large load presented at the output of the driver by the capacitance at the gate of the FET.
Figure 8:
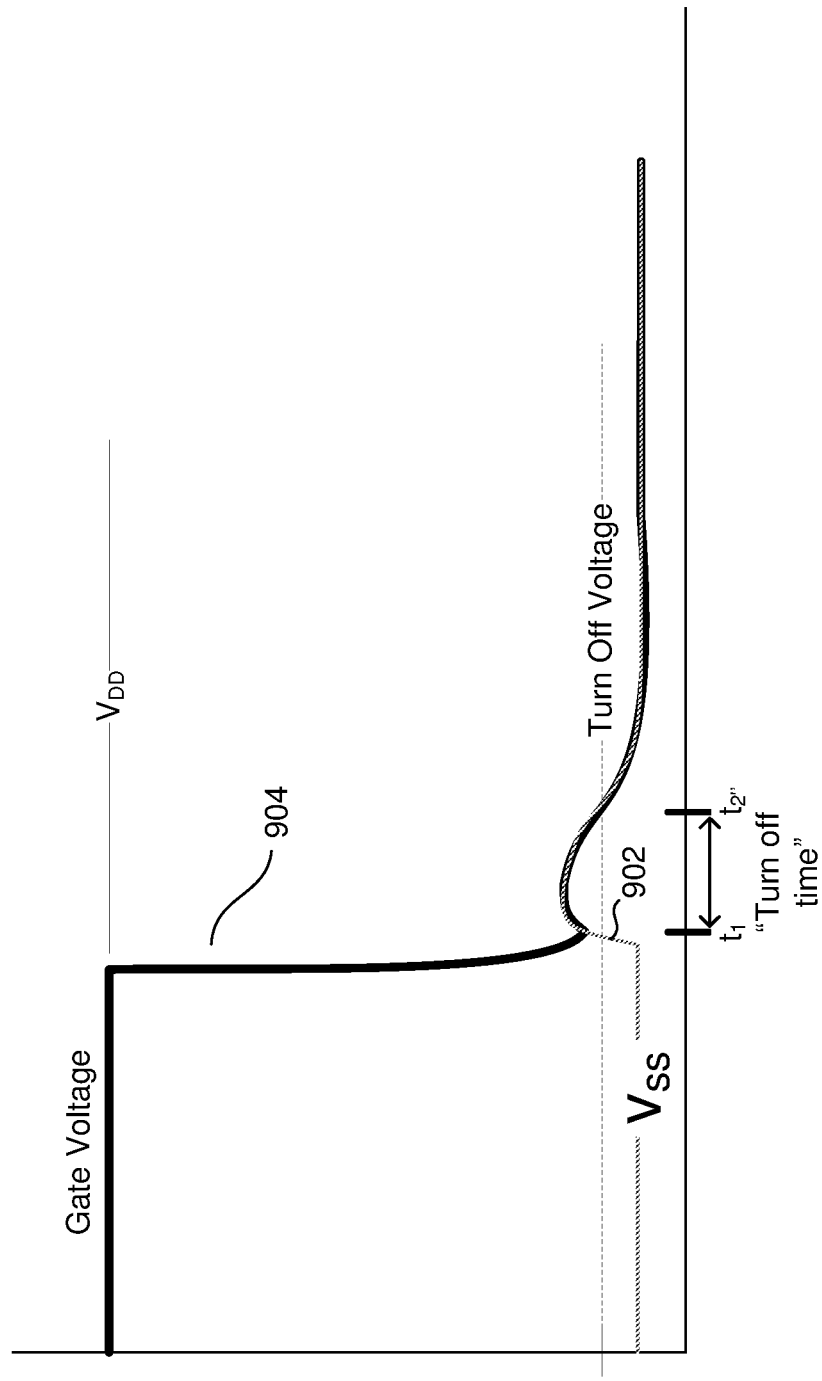
FIG. 8 is an illustration of the positive impact of resetting the gate of a FET.

FIG. 8 is an illustration of the positive impact of resetting the gate of the FET 301 (and each of the FETs in the other switches 608, 610, 614 as desired). A plot 902 of $V_{SS}$ shows a reduction in amount of time $V_{SS}$ rises compared with that show in FIG. 4, due to the reduced loading on the $V_{SS}$ power supply. That is, by resetting the gate of the FET 301, the amount of charge at the output of the switch driver 305 is reduced, thus the amount of time $V_{SS}$ rises is smaller. Furthermore, it can be seen from the plot 904 that the gate voltage will more rapidly achieve a level that allows the switches to attain their desired state more quickly. The resulting "turn off time" between $t_1$ and $t_{2''}$ in FIG. 8 is substantially less than the turn off time between time $t_1$ and $t_2$, shown in FIG. 4. It should be noted that while the discussion above focused on the switch branch 612, in some embodiments, such a reset circuit 704 is provided in each of the switch branches 608, 610, 614.

Figure 9:
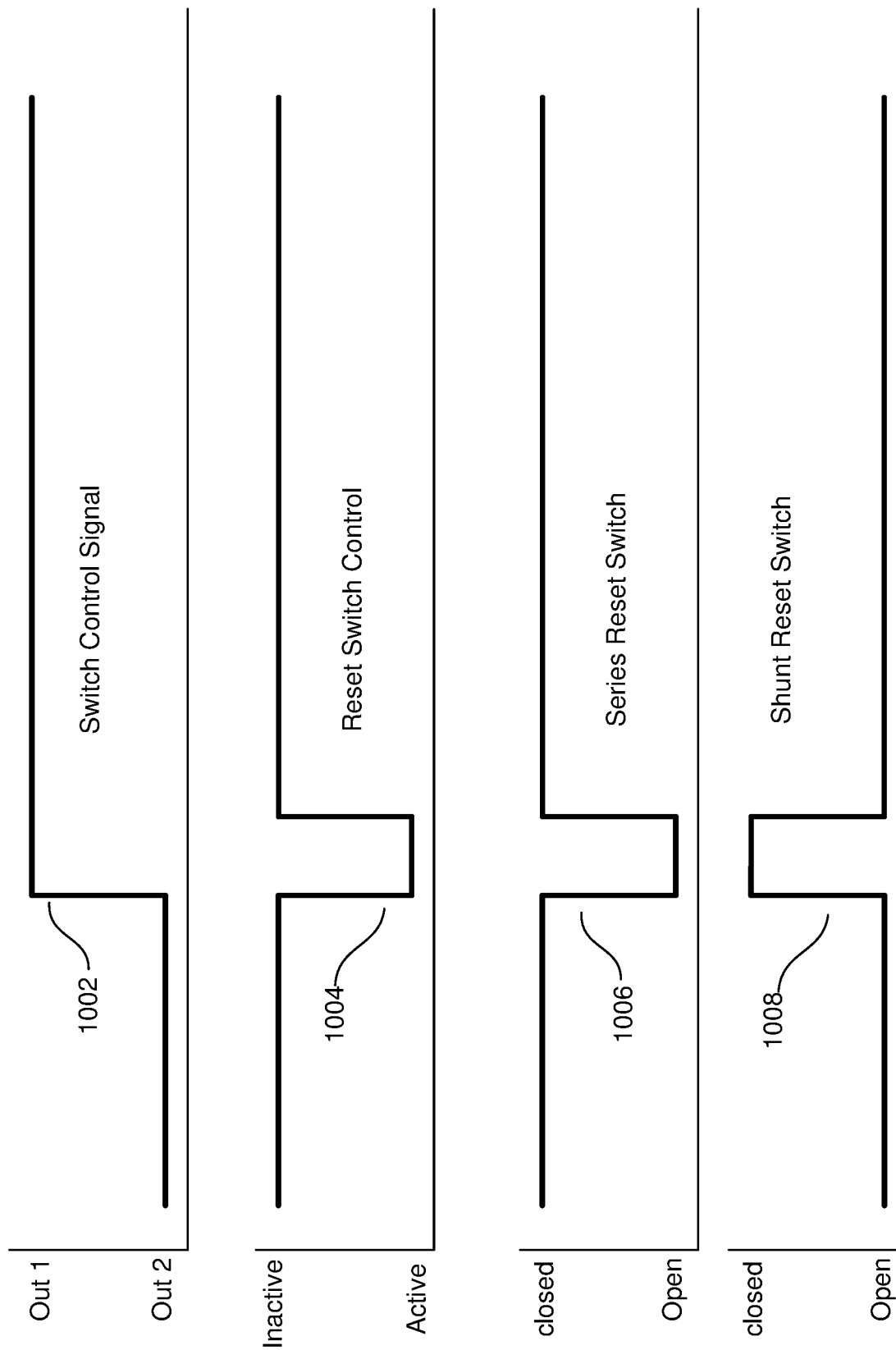
FIG. 9 shows plots of the logical state of the switch control signal, the reset switch control signal, the series reset switch and the shunt reset switch.

Furthermore, in some embodiments, the reset circuit 704 is also momentarily activated when the switch control signal switches from a low state to a high state. FIG. 9 shows plots of the logical state of the switch control signal 1002, the reset switch control signal 1004, the series reset switch 1006 and the shunt reset switch 1008. In this case, the gate of the FET 301 will be transitioning from a low to a high voltage (e.g., from $V_{SS}$ to $V_{DD}$). As in FIG. 7, FIG. 9 merely shows the logical state of the switch control signal and not the voltage. In some cases, the positive voltage supply providing $V_{DD}$ is strong enough to resist the loading at the output of the switch driver 305 when driving the output to $V_{DD}$, making it unnecessary to reset the FET 301 when the gate is being driven high. However, in some cases it may be beneficial to reset the gate of the FET 301 both when driving the gate high as well as when driving it low. As shown in FIG. 9, the FET 301 is reset when the switch control signal goes high by toggling the reset switch control signal momentarily low. When the reset switch control signal is low, the series reset switch is open and the shunt reset switch is closed. Accordingly, the gate of the FET 301 is shunted to ground when the reset switch control signal is low. Once the reset switch control signal returns to the high logic state (reset circuit 704 inactive), the output of the driver 305 is once again connected to the gate of the FET 301.

Methods

Figure 10:
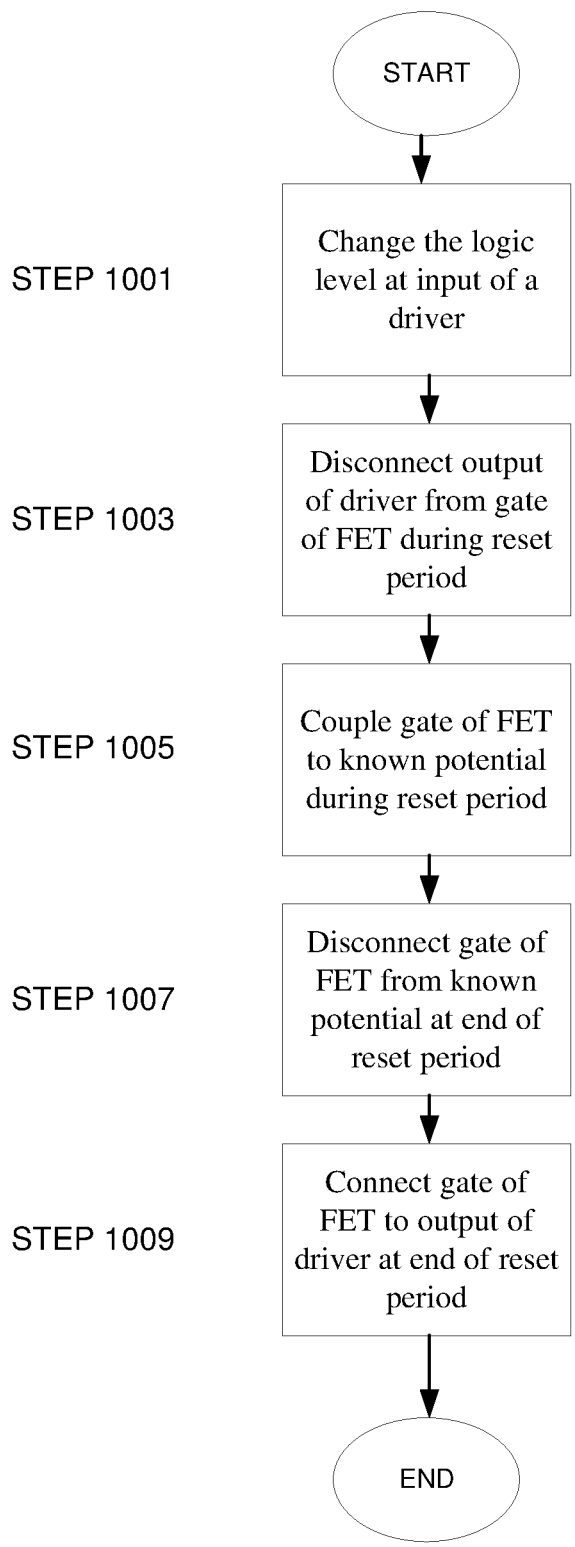
FIG. 10 is an illustration of a method in accordance with some embodiments of the disclosed method and apparatus.

Another aspect of the invention includes a method shown in FIG. 10 for improving the switching speed of a switch, including:
- changing the state of the switch by changing the logic level to the input of a driver, the driver having an output coupled to the gate of a transistor (such as a FET) (STEP 1001);
- disconnecting the output of the driver from the gate of the transistor over a reset period (STEP 1003);
- coupling the gate of the transistor to a known potential that is between the high potential power supply and the low potential power supply applied to the driver during the reset period (STEP 1005);
- disconnecting the gate of the transistor from the known potential at the end of the reset period (STEP 1007); and
- connecting the gate of the transistor to the output of the driver at the end of the reset period (STEP 1009).

The duration of the reset period is dependent upon the number of FETs in the stack and the size of the FETs within the switch branch in which the reset circuit resides. In some embodiments, a reset time of approximately 100 to 150 ns is appropriate.

Fabrication Technologies and Options

The term "MOSFET" means any transistor that has an insulated gate whose to source voltage determines the conductivity of the transistor.

Various embodiments can be implemented to meet a wide variety of specifications. Unless otherwise noted above, selection of suitable component values is a matter of design choice. Various embodiments of the disclosed method and apparatus may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS) bipolar, GaAs HBT, GaN HEMT, GaAs pHEMT, and MESFET technologies.

A number of embodiments of the disclosed method and apparatus have been described. It is to be understood that various modifications may be made without departing from the spirit and scope of the claimed invention. For example, some of the steps described above may be optional. Various activities described with respect to the methods identified above can be executed in repetitive, serial, or parallel fashion. Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A multiport switch including:
  (a) a common port;
  (b) a plurality of switch branches coupled between the common port and an associated signal port, each switch branch including:
    (1) one or more field effect transistors (FETs) coupled between the associated signal port and the common port, each FET having a gate responsive to control signals to turn the FET on or off;
    (2) a switch control input configured to receive control signals to be applied to the gate of each FET; and
    (3) a reset circuit coupled between the switch control input and the gate of each FET, the reset circuit having a reference potential input and a reset control port;
      wherein the reset circuit couples the gate of each FET to the reference potential input during a reset period defined by a reset pulse received through the reset control port, the reset pulse being generated in response to a change in state of the control signals applied to the switch control input; and
      wherein the reset circuit couples the gate of the FET to the switch control input in the absence of the reset pulse.

2. The multiport switch of claim 1, wherein, during the reset period, the reset circuit reduces electrical charge accumulated on the gate of each FET.

3. The multiport switch of claim 1, further comprising a driver coupled between the switch control input and the signal input of the reset circuit.

4. The multiport switch of claim 3, wherein the driver is coupled to a positive power supply and to a negative power supply, and the reference potential input is coupled to a reference potential between the potential of the negative and positive power supplies.

5. The multiport switch of claim 4, wherein the reference potential is ground.

6. The multiport switch of claim 1, wherein the change in state of the signal applied to the switch control input is from a high level to a low level.

7. The multiport switch of claim 1, wherein the change in state of the signal applied to the switch control input is from a low level to a high level.

8. The multiport switch of claim 1, wherein the one or more FETs includes two or more FETs coupled in series between the associated signal port and the common port.

9. A multiport switch including:
(a) a common port;
(b) a plurality of switch branches coupled between the common port and an associated signal port, each switch branch including:
  (1) one or more field effect transistors (FETs) coupled between the associated signal port and the common port, each FET having a gate responsive to control signals to turn the FET on or off;
  (2) a switch control input configured to receive control signals to be applied to the gate of each FET; and
  (3) a reset circuit coupled between the switch control input and the gate of each FET, the reset circuit having a reference potential input and a reset control port;
  wherein the reset circuit couples the gate of each FET to the reference potential input during a reset period defined by a reset pulse received through the reset control port, the reset pulse being generated in response to a change in state of the control signals applied to the switch control input; and
  wherein the reset circuit couples the gate of each FET to the switch control input after the reset period.

10. The multiport switch of claim 9, wherein, during the reset period, the reset circuit reduces electrical charge accumulated on the gate of each FET.

11. The multiport switch of claim 9, further comprising a driver coupled between the switch control input and the signal input of the reset circuit.

12. The multiport switch of claim 11, wherein the driver is coupled to a positive power supply and to a negative power supply, and the reference potential input is coupled to a reference potential between the potential of the negative and positive power supplies.

13. The multiport switch of claim 9, wherein the change in state of the signal applied to the switch control input is from a high level to a low level.

14. The multiport switch of claim 9, wherein the change in state of the signal applied to the switch control input is from a low level to a high level.

15. The multiport switch of claim 9, wherein the one or more FETs includes two or more FETs coupled in series between the associated signal port and the common port.

16. A multiport switch including:
(a) a common port;
(b) a plurality of switch branches coupled between the common port and an associated signal port, each switch branch including:
  (1) one or more field effect transistors (FETs) coupled between the associated signal port and the common port, each FET having a gate responsive to control signals to turn the FET on or off;
  (2) a switch control input configured to receive control signals to be applied to the gate of each FET; and
  (3) a reset circuit coupled between the switch control input and the gate of each FET, and configured to reduce, in response to a change in state of a signal applied to the switch control input, electrical charge accumulated on the gate of each FET and then to couple the switch control input to the gate of each FET.

17. The multiport switch of claim 16, wherein the reset circuit includes a series switch coupled to the gate of each FET, and further comprising a driver coupled between the switch control input and the series switch of the reset circuit such that, when the series switch is closed, a signal applied to the switch control input is coupled to the gate of each FET.

18. The multiport switch of claim 16, wherein the change in state of the signal applied to the switch control input is from a high level to a low level.

19. The multiport switch of claim 16, wherein the change in state of the signal applied to the switch control input is from a low level to a high level.

20. The multiport switch of claim 16, wherein the one or more FETs includes two or more FETs coupled in series between the associated signal port and the common port.

* * * * *